United States Patent [19]
Kroeger et al.

[11] Patent Number: 5,768,323
[45] Date of Patent: Jun. 16, 1998

[54] SYMBOL SYNCHRONIZER USING MODIFIED EARLY/PUNCTUAL/LATE GATE TECHNIQUE

[75] Inventors: Brian W. Kroeger, Sykesville; Joseph B. Bronder, Elkridge, both of Md.; Tod A. Oblak, Indiana, Pa.; Jeffrey S. Baird, Baltimore, Md.

[73] Assignee: Westinghouse Electric Corporation, Pittsburgh, Pa.

[21] Appl. No.: 322,854

[22] Filed: Oct. 13, 1994

[51] Int. Cl.$^6$ ........................................................ H04L 7/00
[52] U.S. Cl. ........................ 375/355; 375/344; 375/345
[58] Field of Search .............................. 375/304, 324, 375/326, 340, 343, 346, 350, 355, 344, 345

[56] References Cited

U.S. PATENT DOCUMENTS

| | | | |
|---|---|---|---|
| 4,143,322 | 3/1979 | Shimamura | 325/320 |
| 4,318,049 | 3/1982 | Mogenson | 329/50 |
| 4,466,108 | 8/1984 | Rhodes | 375/83 |
| 4,787,096 | 11/1988 | Wong | 375/120 |
| 4,879,728 | 11/1989 | Tarallo | 375/80 |
| 5,390,207 | 2/1995 | Fenton et al. | 375/200 |
| 5,517,535 | 5/1996 | Kroeger et al. | 375/373 |
| 5,566,214 | 10/1996 | Kroeger et al. | 375/355 |
| 5,579,345 | 11/1996 | Kroeger et al. | 375/344 |

FOREIGN PATENT DOCUMENTS

| | | |
|---|---|---|
| 0389027 | 9/1990 | European Pat. Off. . |
| 4236178 | 8/1993 | Germany . |
| 2165110 | 4/1986 | United Kingdom . |
| 9301667 | 1/1993 | WIPO . |

OTHER PUBLICATIONS

Thompson, et al., "High–Speed Integrated Receiver Demod and Tracking ASIC.", Military Communications In A Changing World Milcom 91, IEEE Conference Record (CAT No. 91CH2981–9), McLean, VA, USA, vol. 1 pp. 42–46.

Connelly, "Design of the Westinghouse Series 1000 Mobile Phone," IEEE, pp. 347–350, May 18, 1993.

Connelly, "The Westinghouse Series 1000 Mobile Phone: Technology and Applications," IEEE, pp. 375–379, May 18, 1993.

Primary Examiner—Stephen Chin
Assistant Examiner—Bryan Webster

[57] ABSTRACT

A method and apparatus for synchronizing symbol timing for a QPSK demodulator. A matched filter pair outputs respective "early-punctual-late" signals. The early and late signals are input to a symbol synchronizing estimator that produces an interpolation control signal used by the filters to synchronize the symbol timing to the sample timing. The punctual signal is output as an information bearing signal representing the received inphase and quadrature signals. The matched filters are interpolating matched filters. The symbol synchronizing estimator normalizes the early and late signals in a manner that allow the demodulator to "flywheel" over signals having a low signal to noise ratio below a predetermined threshold.

3 Claims, 16 Drawing Sheets

MATCHED FILTERS AND SYMBOL TRACKING FUNCTIONS

| ENCODER INPUT PAIR | PHASE OF PREVIOUS OUTPUT | PHASE OF CURRRNT OUTPUT | PHASE DIFFERENCE |
|---|---|---|---|
| 1,1 | +45 | -135 | 180 |
| 1,1 | -45 | +135 | 180 |
| 1,1 | +135 | -45 | 180 |
| 1,1 | -135 | +45 | 180 |
| 1,0 | +45 | -135 | -90 |
| 1,0 | -45 | +135 | -90 |
| 1,0 | +135 | -45 | -90 |
| 1,0 | -135 | +45 | -90 |
| 0,1 | +45 | -135 | +90 |
| 0,1 | -45 | +135 | +90 |
| 0,1 | +135 | -45 | +90 |
| 0,1 | -135 | +45 | +90 |
| 0,0 | +45 | -135 | 0 |
| 0,0 | -45 | +135 | 0 |
| 0,0 | +135 | -45 | 0 |
| 0,0 | -135 | +45 | 0 |

FIG. 4

SPECTRUM OF NCO COMPLEX EXPONENTIAL VS. FREQUENCY NORMALIZED SAMPLE RATE SHOWS SPURIOUS IS -150 dB FROM SIGNAL.

PLOT OF OUTPUT OF THE NORMALIZER SHOWS AN INITIAL SMALL BIAS IN THE NOISE DUE TO SYMBOL TIMING OFFSET.

OUTPUT OF THE FIRST INTEGRATOR SHOWS THE INITIAL EFFECT OF THE SMALL BIAS (POSITIVE PULSE).

THE OUTPUT OF THE SECOND INTEGRATOR CLEARLY SHOWS THE STEP TIMING OFFSET.

MATCHED FILTER SAMPLE TIMING

SYMBOL SYNCHRONIZER USING MODIFIED EARLY/PUNCTUAL/LATE GATE TECHNIQUE

RELATED APPLICATIONS

U.S. patent application, Ser. No. 08/322,858 entitled "Mobile Terminal Apparatus and Method for a Satellite Communication System" filed by Albert J. Fasulo II, Denise M. Cammarata, Keith W. Janson, Samuel S. Anderson, Raymond R. Cooper, and Roy Stehlik, on the same date as the instant application, which is a continuation-in-part of U.S. patent application Ser. No. 08/242,400 filed May 13, 1994, is incorporated by reference.

U.S. patent application, Ser. No. 08/322,847 entitled "Carrier Acquisition Technique For Mobile Radio QPSK Demodulator" filed by Brian W. Kroeger, Joseph B. Bronder, and Jeffrey S. Baird on the same date as the instant application.

U.S. patent application, Ser. No. 08/322,846 entitled "Locally Coherent QPSK Detection With Differential Decoding For A Fading Channel" filed by Brian W. Kroeger, Joseph B. Bronder, and Jeffrey S. Baird, on the same date as the instant application, is incorporated by reference.

U.S. Pat. No. 5,523,726 entitled "A Digital Quadriphase-Shift Keying Modulator" filed by Brian W. Kroeger and Roy Stehlik, is incorporated by reference.

U.S. Pat. No. 5,517,535 entitled "Numerically Controlled Oscillator With Coupled Exponential Outputs Using Recursion Technique" filed by Brian W. Kroeger and Jeffrey S. Baird, is incorporated by reference.

U.S. patent application, Ser. No. 08/322,840 entitled "Carrier Tracking Loop For QSPK Demodulator" filed by Brian W. Kroeger, Jeffrey S. Baird, and Joseph B. Bronder, on the same date as the instant application, is incorporated by reference.

BACKGROUND OF THE INVENTION

The present invention relates to a mobile terminal for a communication system, and more particularly to a method and apparatus for digital receiving in a communication system.

While the invention is subject to a wide range of applications, it is especially suited for use with a satellite communication system, and will be particularly described in that connection.

Description of Related Art

In a typical satellite communication system, outgoing RF signals transmitted from a mobile terminal unit are received directly by the satellite. The satellite in turn retransmits the RF signals to a ground station that is connected by wire to a public switched telephone network (PSTN), which in turn routes the outgoing signals to either a conventional telephone or to another mobile terminal unit of a satellite or cellular network. Incoming signals from a conventional wired telephone are conducted from the PSTN to the satellite ground station, which in turn transmits RF signals to the satellite for retransmission to the mobile terminal unit. Thus, communication can be between two mobile terminal units or between a mobile terminal unit and a conventional telephone connected to a PSTN, or between a satellite mobile terminal unit and a cellular mobile terminal unit, for example. In each of the aforesaid conditions (except mobile terminal to mobile terminal), the communication is routed through a PSTN.

It has been proposed, to provide a satellite communications network that utilizes geosynchronous satellites each of which is capable of covering an area corresponding to a substantial portion of the North American continent, so that one satellite with approximately six beams will cover the entire continent from Alaska to Mexico. The satellites for such a network will be approximately 22,600 miles above the equator and will be designed to operate in the L-band of RF frequencies. For example, the frequency of the signal being transmitted to the satellite will be between 1626 MHz to 1660 MHz, and the frequency of the signal received from the satellite will be between 1525 MHz to 1559 MHz. Energy travelling this great distance undergoes huge attenuation such that the power flux density incident at the antenna of the mobile unit is approximately $10^{-14}$ watts per square meter. This grossly attenuated signal is further degraded by noise, and other satellite channel impairments such as Rician fading due to multipath-fading.

Mobile terminal units capable of receiving signals of this order of magnitude are either limited to paging signals or require extremely sophisticated hardware, which is bulky and heavy and does not lend itself to mobility. Also, the limited functions and expense of such terminal equipment would prevent its acceptance among a large segment of potential users.

In light of the foregoing, there is a need for a mobile terminal unit that is not only capable of reliably receiving the attenuated signals, subject to Rician fading, of a high altitude satellite for voice, facsimile, and data communication, but is also compact, lightweight, and relatively inexpensive to manufacture. Conventional demodulators use an early-late symbol synchronizer to find an optimal symbol timing for sampling a QPSK data sequence. This type of symbol synchronizer works well under ideal conditions, but does not work well in a fading environment and is not designed to work with complex inputs.

SUMMARY OF THE INVENTION

The present invention overcomes the problems and disadvantages of the prior art by using an early-punctual-late gate technique in a symbol synchronizer of the invention. The "punctual" signal functions as an information bearing signal. The invention operates with complex input signals (I and Q). The early and late signals indicate an error in synchronization between a symbol timing of the received signal and the timing of the matched filter. The input signals are optimal Nyquist filtered pulses. The invention can accept a large dynamic range of input signals because it normalizes timing errors/signals created from Early and Late signals that are fed back to correct the timing of the matched filters of the symbol synchronizer.

In accordance with the purpose of the invention, as embodied and broadly described herein, the invention is a symbol synchronizer in a telecommunications device, comprising: a plurality of filters, receiving a sequence of incoming pairs of inphase and quadrature signals in accordance with a symbol timing, each of the pair of matched filters outputting an early signal, a punctual signal, and a late signal, the early signal and the late signal indicating an error in synchronization between a symbol timing of the received signals and the timing of the matched filter, and the punctual signal being an information bearing signal indicating the contents of the received inphase and quadrature signals; a symbol synchronizing estimator, connected to the plurality of matched filters, receiving from each of the pair of matched filters the early signal and the late signal and outputting an interpolation signal to the pair of matched filters; and adjusting the matched filters for adjusting the relative delay of the matched filter with regard to the symbol timing of the incoming signal in accordance with the interpolation signal.

Objects and advantages of the invention will be set forth in part in the description which follows and in part will be obvious from the description or may be learned by practice of the invention. The objects and advantages of the invention will be realized and attained by means of the elements and combinations particularly pointed out in the appended claims.

BRIEF DESCRIPTION OF THE DRAWINGS

The accompanying drawings, which are incorporated in and constitute a part of this specification, illustrate several embodiments of the invention and, together with the description, serve to explain the principles of the invention.

FIG. 4 is a chart showing an encoding scheme for a locally coherent QPSK system;

DETAILED DESCRIPTION OF THE PREFERRED EMBODIMENT

Reference will now be made in detail to the preferred embodiment of the invention, examples of which are illustrated in the accompanying drawings. Wherever possible, the same reference numbers will be used throughout the drawings to refer to the same or like parts.

Figure 1:
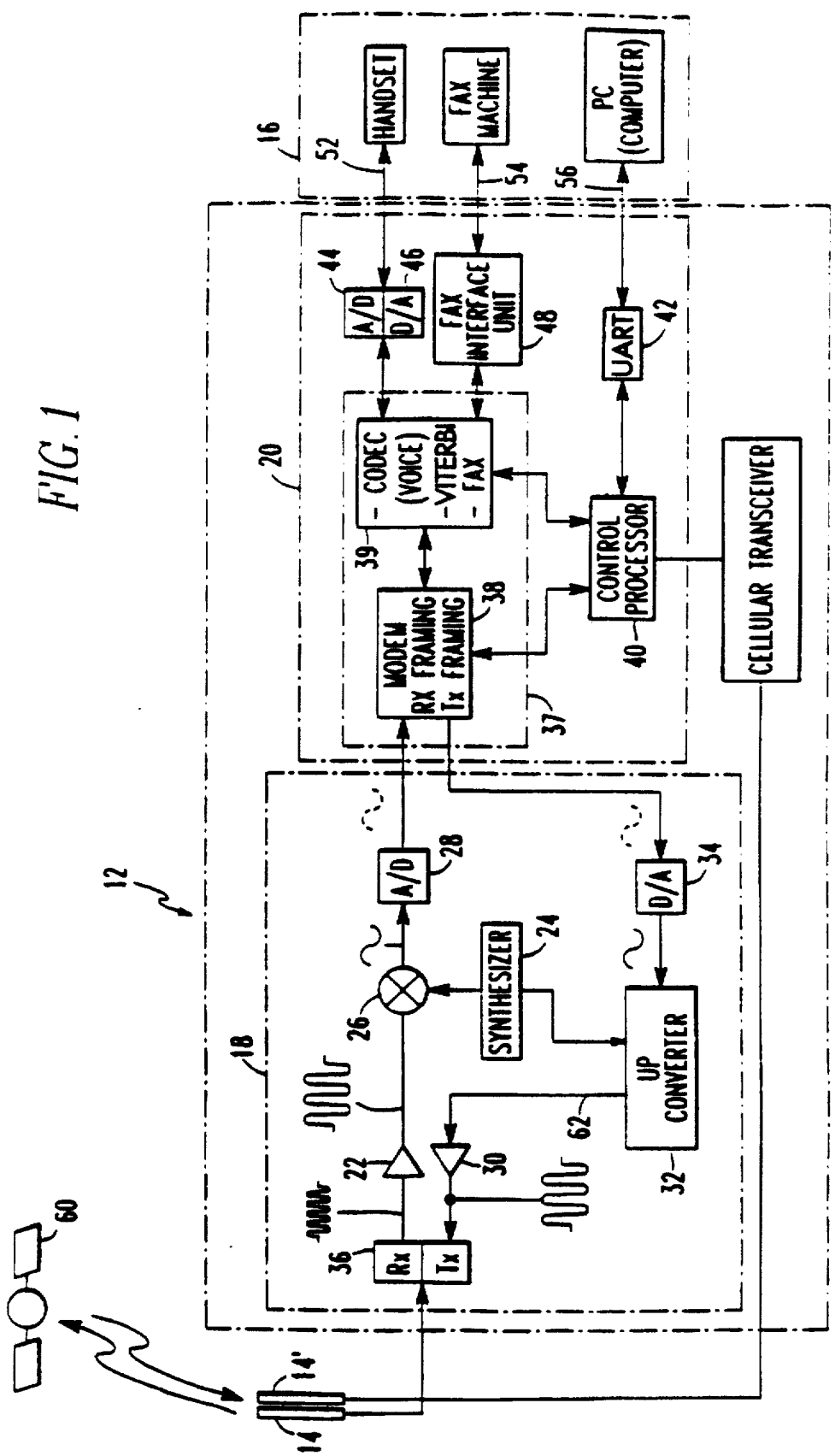
FIG. 1 is a schematic block diagram of a mobile terminal apparatus.

FIG. 1 shows a mobile terminal unit comprising a transceiver 12, an antenna 14, and one or more user interfaces 16. The transceiver 12 has an RF section 18 and a processor board 20.

The RF section has a receiving portion that includes a low noise amplifier 22, a down converter 26, and an analog to digital converter (A/D) 28. The RF section also has a transmitter portion that includes a high power amplifier (HPA) 30, an upconverter 32, signal line 62, and digital-to-analog converter (D/A) 34. The antenna 14 is connected to the RF section through a diplexer 36.

The processor board has a digital signal processor 37 including a modem processor 38 and a coder/decoder and fax processor 39, a control processor 40, a universal asynchronous receiver/transmitter (UART) 42, an A/D converter 44, a D/A converter 46, and a fax interface unit 48. The user interfaces of the terminal unit include an output 52 for a handset, an output 54 for a facsimile machine and an output 56 for connection to a personal computer. The apparatus may also include a cellular transceiver board.

The transmit signal begins in the processor board 20 as digital data, which is then converted into digitized, modulated waveform samples. This digitized waveform, which is created by the processor 37, is conducted to the digital-to-analog (D/A) converter 34 before the upconverter 32 of the RF section. The converter 34 converts the digitized waveform into both an analog I (in phase) and analog Q (quadrature) waveform. The analog I and Q waveforms are then sent to the mixer or upconverter modulator 32 where they are upconverted to an L-Band, and then summed to form a low level L-Band transmit signal on line 62. This low level L-Band transmit signal is amplified by the high power amplifier 30. The resulting high level L-Band transmit signal then passes through transmit side of the diplexer 36 and is steered towards the MT antenna 14 from which it travels to the satellite 60.

In operation, the DSP 37 reads the received signal waveform samples from the A/D converter 28, and processes these samples as they arrive. The L-Band receive signal is mixed down to the low IF frequency to aid in signal filtering and to reduce the A/D sample rate so that the digital signal processing can keep up with the sample arrivals. Once the receive signal has been sampled and loaded into the DSP 37, all subsequent signal processing is performed by the DSP 37 as controlled by the control processor 40. Received signals are demodulated, in other words translated, from their waveform representation into their digital data representation, decoded and packaged for voice, fax or data processing at the DSP 39.

The processor board comprises a signal processor including a digitally implemented demodulator function, a digitally implemented modulator function, a digitally implemented receive framing function coupled to the demodulator, a digitally implemented transmit framing function coupled to the modulator function, and a digitally implemented encoding function and decoding function coupled to the transmit and receive function, respectively.

As the QPSK signal is received, several types of synchronization must be performed on the signal. First, the system must determine the frequency of the "carrier wave" that is being phase modulated. Second, the system must determine where each symbol (represented by multiple bits) begins, i.e., "symbol synchronization."

Figure 2:
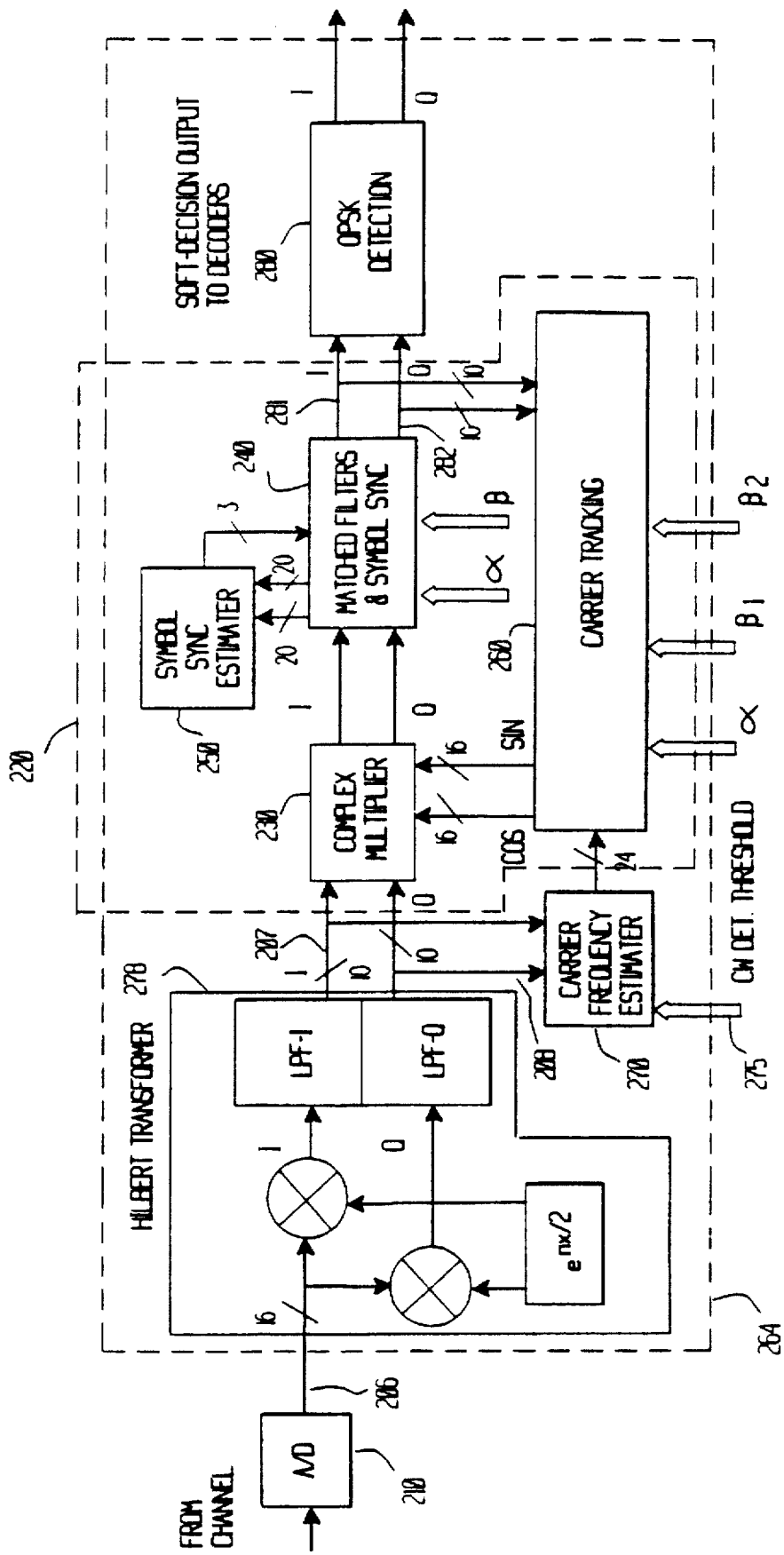
FIG. 2 is a schematic block diagram of a demodulator of the system of FIG. 1.

FIG. 2 is a schematic block diagram of a demodulator 264, which is implemented as instructions executed in DSP 37 of the system of FIG. 1. In FIG. 2, an analog signal 205 is received and converted to a digital signal 206 by the analog-to-digital (A/D) converter 28. Signal 206 is input to Hilbert Transformer 278, which yields a digital 10-bit in-phase signal (I) 207 and a digital 10-bit quadrature signal (Q) 208. Signals (I) 207 and (Q) 208 are input to carrier tracking loop 220, which includes a complex multiplier 230, matched filters and symbol synchronizer 240, a symbol synchronizer estimator 250, a carrier tracking element 260, and a carrier frequency estimator 270. The output from the carrier tracking loop 220 is input to a QPSK detector 280.

The elements of demodulator 264 preferably are embodied in instructions performed by processor 37 of FIG. 1, which executes a software program stored in a memory, such as a ROM (not shown). Processor 37 preferably is a DSP 320C51 fixed point processor manufactured by Texas Instruments Corporation. However, any processor capable of performing the process described could be used to implement the invention. The bit-widths of the signals in the carrier tracking loop 220 are chosen to provide sufficient dynamic range for the particular application by minimizing the effects of quantization noise while preventing numerical overflow.

Certain elements of the demodulator 264, such as oscillator 314, symbol synchronizer 240, or symbol synch estimator 250 may be implemented in hardware. A person of ordinary skill in the art understands that FIG. 2 can represent either a hardware or a software implementation of the present invention, and that the invention is not limited to either a hardware or a software implementation.

Although carrier tracking loop 220 is shown to include oscillator 314, symbol synchronizer 240, and symbol synch estimator 250, it should be understood that carrier tracking loop 220 may also be implemented using other, conventionally known elements in place of any or all of at least elements 314, 240, and 250. In addition, oscillator 314 may used in other systems requiring an oscillator and is not limited to usage in the system shown herein. Filter element 240 and/or symbol synch estimator 250 also may be used in other systems and are not limited to usage in the system shown herein.

In accordance with the present invention, the QPSK detector uses a technique for locally coherent detection (demodulation) of a digital QPSK modulated signal that performs especially well in a "fading environment." The parameters of the technique can be optimized to suit the particular fading characteristics and statistics in order to optimize performance in a particular known fading environment. The locally coherent QPSK detector 280 of the present invention produces a multi-bit "soft-decision" output that is then input to a forward error correction (FEC) element (not shown).

FIG. 4 is a chart showing an encoding scheme for a locally coherent QSPK system. FIG. 4 shows how bit pairs are encoded. The encoder output is a complex number whose phase is 45 degrees plus an integer multiple of 90 degrees. The encoder input determines the difference between the phases of two consecutive encoder outputs. Thus, if, for example, the encoder input is 1,1, then the difference between the phase of the current encoder output and the previous encoder output is always 180 degrees independent of the actual value of the previous output. Similarly, the phase difference between current and previous encoder outputs is 90 degrees when the encoder input is 0,1. Thus, the phase differences of the encoder outputs contain the information necessary to recover the bit pairs that make up the encoder inputs.

I. A Carrier Tracking Loop in a Mobile Communication System

Figure 3A:
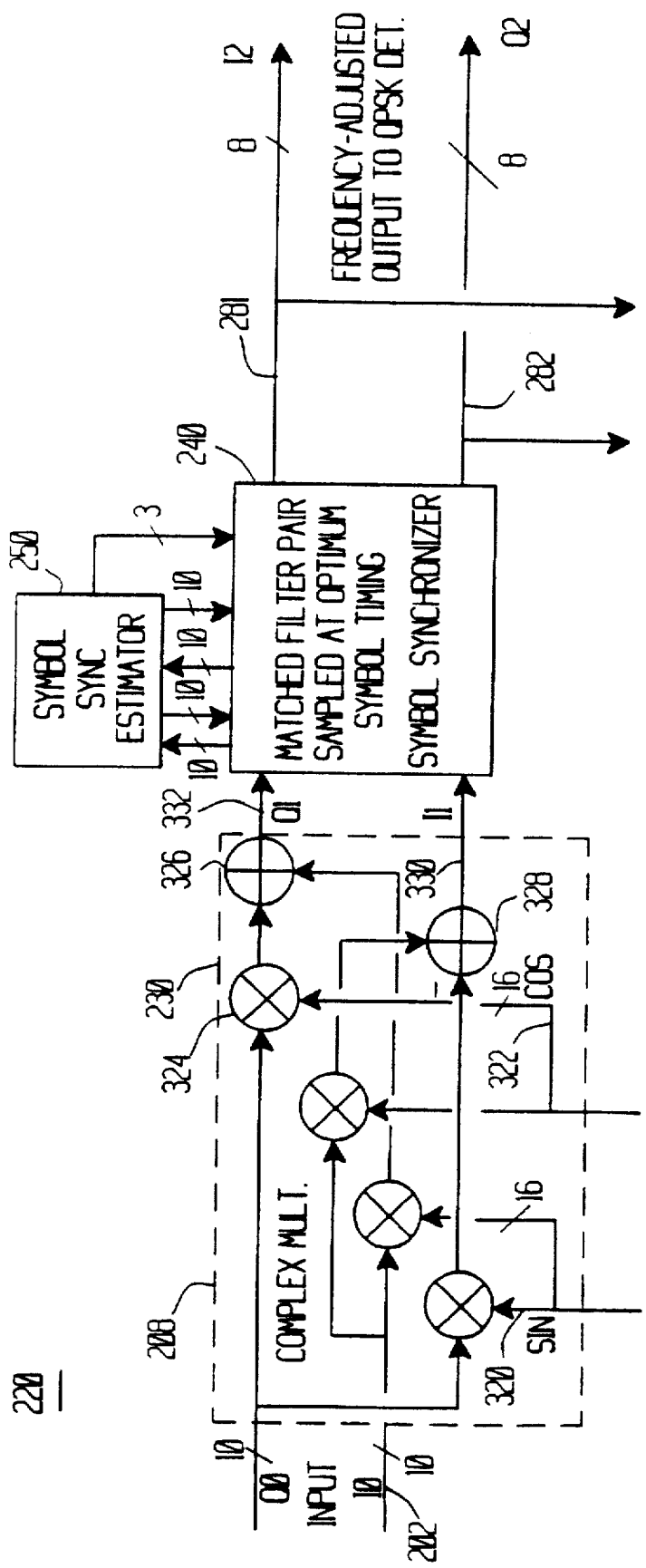
FIGS. 3A and 3B are schematic block diagram of a carrier tracking loop for the demodulator of FIG. 2.
Figure 3B:
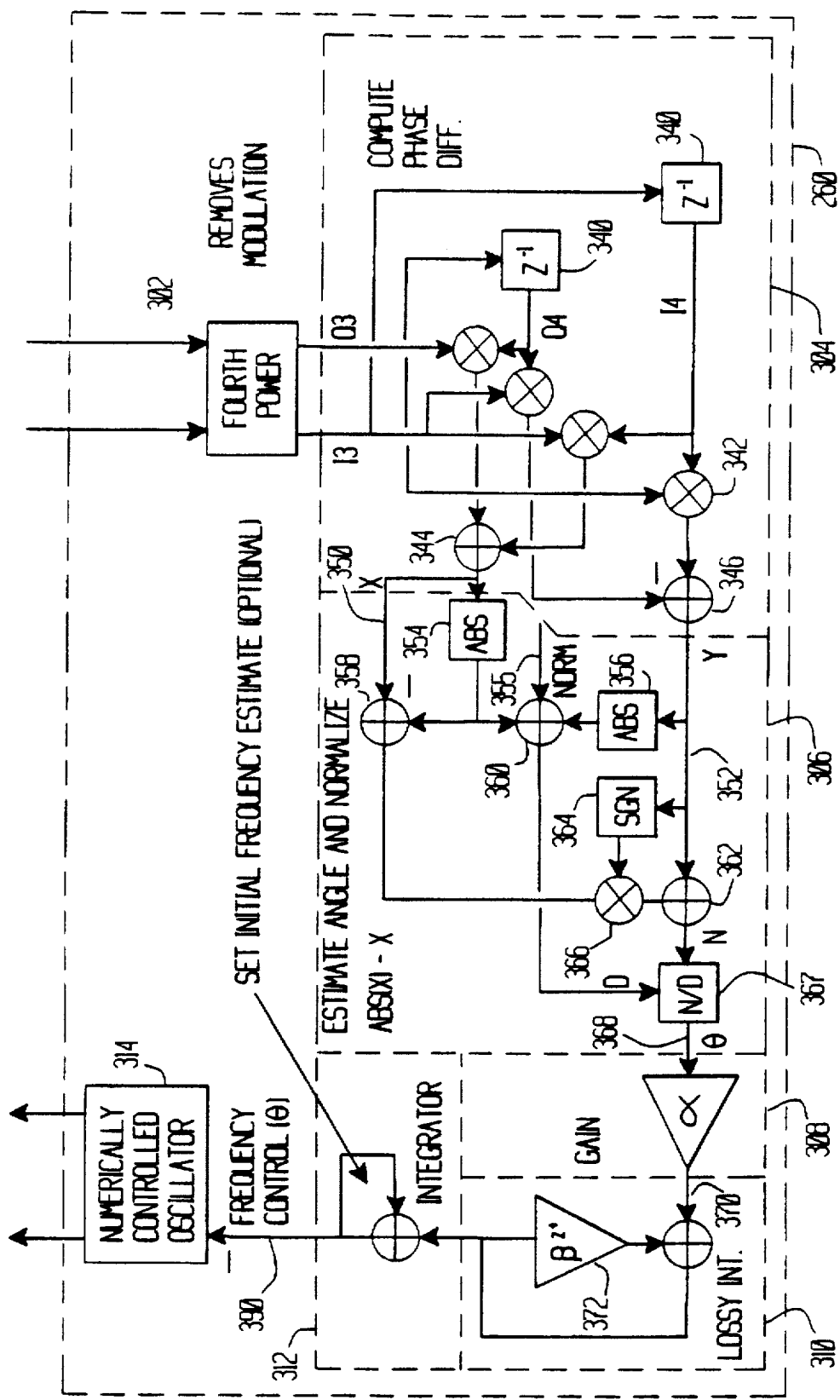

FIG. 3 is a schematic block diagram of the carrier tracking loop 220 for the demodulator 264 of FIG. 2. The carrier tracking loop 220 includes the complex multiplier 230, the matched symbol synchronizer 240, the symbol synchronization estimator 250, a fourth power element 302, the carrier tracking element 260, and a numerically controlled oscillator (NCO) 314. Carrier tracking element 260 includes a frequency discriminator 304, a frequency error estimator 306, a gain element 308, a lossy digital integrator 310, and a perfect integrator 312. In one implementation an initial value of integrator 312 is set in accordance with a signal input from the carrier frequency estimator 270 of FIG. 2, where the input represents an initial frequency estimate from estimator 270.

Figure 14:
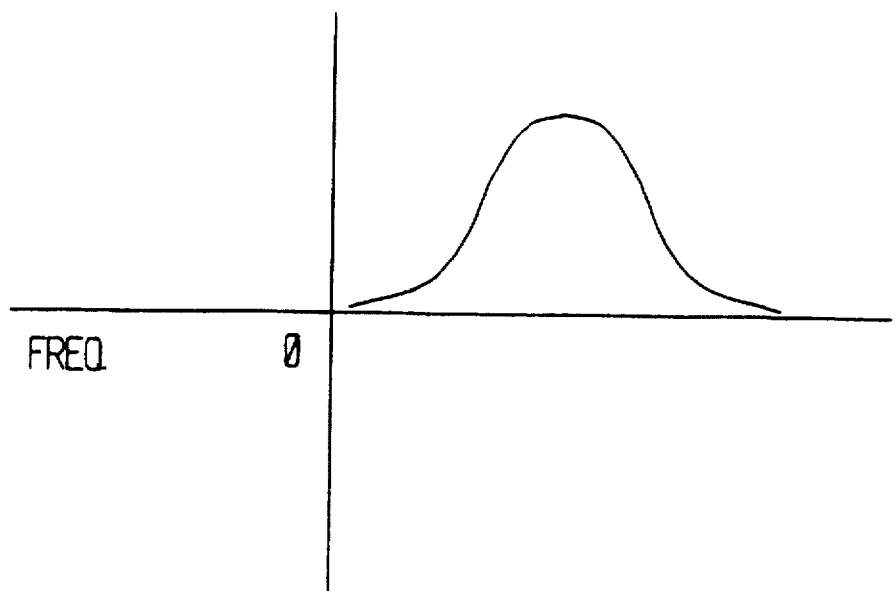
FIG. 14 shows a exemplary frequency spectrum of an incoming signal to the carrier tracking loop of FIG. 3 before it is shifted to near baseband frequency.
Figure 15:
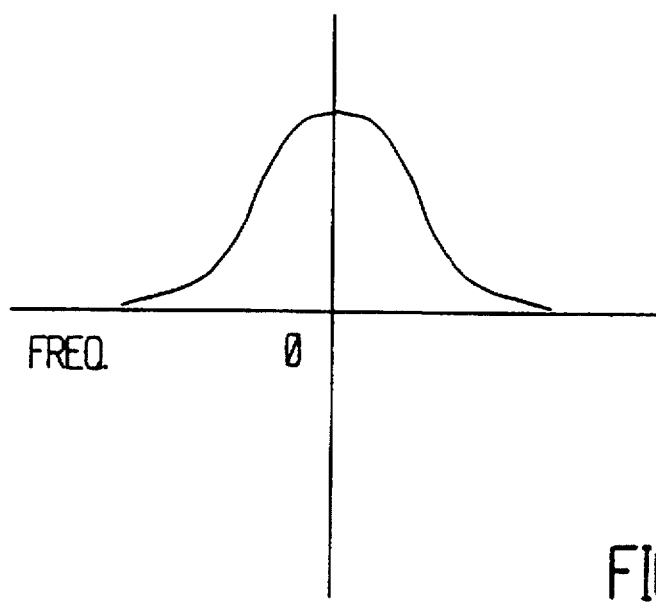
FIG. 15 shows a frequency spectrum of the signal of FIG. 14 after it is shifted to near baseband frequency.
Figure 16:
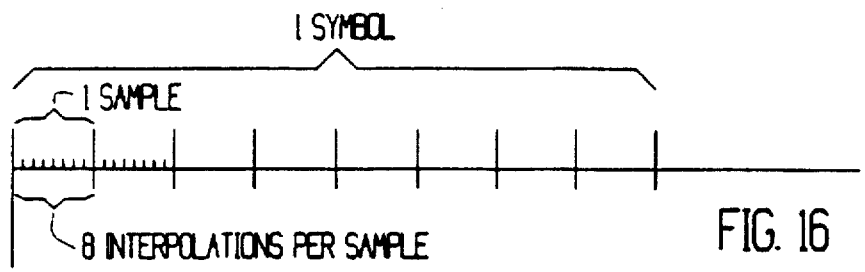
FIG. 16 shows an example input to the matched filter pair and symbol synchronizer of FIG. 3.

The purpose of the carrier tracking loop is to minimize the carrier frequency offset error after the QPSK modulated signal has been translated from a radio frequency or an intermediate frequency to near baseband frequency. FIG. 14 shows a frequency spectrum of an incoming signal before shifting. FIG. 15 shows a frequency spectrum of the spectrum of FIG. 14 after it is shifted by the complex multiplier 230.

The carrier tracking loop 220 is a closed-loop servo mechanism which, through negative feedback, attempts to keep the frequency of the NCO 314 equal to the complex conjugate of the incoming offset-baseband carrier frequency. Loop 220 is a frequency locked loop (FLL). The digital 10-bit in-phase signal I 207 and the digital 10-bit quadrature signal Q 208 are input to the complex multiplier 230. Output signals 281 and 282 from the matched filter pair 240 have some arbitrary phase rotation, some frequency offset, and a frequency tracking error.

The carrier tracking loop 220 is designed with parameters $\alpha$ and $\beta$ such that residual frequency perturbations are sufficiently small to minimize adverse effects on the subsequent detection by QPSK detector 280. Parameters $\alpha$ and $\beta$ are chosen to yield a minimum frequency tracking response time (a fast reacquisition time) with minimum "ringing" and a low loop noise bandwidth. The arbitrary phase offset (stationary or slowly changing) is removed by the subsequent QPSK detector 280.

The offset baseband signal 207 and 208 input to the complex multiplier 230 of the carrier tracking loop 220 can be represented as follows:

$$S_{input}(m) = A_m \cdot QPSK(m) \cdot e^{j(2\pi f_{off} m T_{sample} + \phi_m)} + noise_{input}(m) \quad (1)$$

A 16-bit sine signal 320 and a 16-bit cosine signal 322 from the NCO 314 are also input to the complex multiplier 230. The complex multiplier 230 includes four multipliers 324, an adder 326, and a subtracter 328. The complex multiplier 230 outputs a digital 16-bit in-phase signal I 330 and a digital 16-bit quadrature signal Q 332. After mixing (i.e., multiplication by the complex multiplier 230) the complex number represented by I,Q signals 330 and 332 are input to the matched filter pair and symbol synchronizer 240.

In the matched filter pair and symbol synchronizer 240, the frequency corrected baseband signal is filtered at an optimum symbol timing. The output of the matched filter 240 is also required for operation of the QPSK detector 280 of FIG. 2 and are output thereto. By placing the matched filter 240 within the carrier tracking loop 220, out of band signals are filtered out, allowing the loop to track with reduced interference. The output symbol samples from the matched filter 240 have arbitrary phase offset and a small residual frequency perturbation (frequency tracking error) that are not corrected by the carrier tracking loop. Such an error is due, e.g., to acceleration or drift from oscillator 314.

The NCO 314 generates a complex exponential (sine and cosine signals 320 and 322), which is as close as possible to the complex conjugate of the incoming signal 207 and 208.

$$S_{NCO}(m) = e^{j2\pi f_{NCO} \cdot mT_{sample}} = e^{-j2\pi (f_{off} - \Delta f) \cdot mT_{sample}} \quad (2)$$

In closed loop operation, the frequency perturbation ($\Delta f$) term of equation 2 is a zero mean random process. The input to the matched filter element 240 is then:

$$S_{input}(m) \cdot S_{NCO}(m) = A_m \cdot QPSK(m) \cdot e^{j(2\pi \cdot \Delta f \cdot mT_{sample} + \phi_m)} + noise(m) \quad (3)$$

The input sample rate with index m is greater than the symbol rate with index n by a preferred factor equal to the number of complex input samples representing each symbol. In a preferred embodiment, eight samples are taken for each symbol. The symbol synchronization output samples $S_{MF}(n)$ of the symbol synchronizer 240 preferably is represented by:

$$S_{MF}(n) = a_n \cdot e^{j(2\pi \cdot \Delta f \cdot nT_s + d_n \pi/2 + \phi_n)} + noise_{MF}(n) \quad (4)$$

where d is 0,1,2,3 dependent upon the pair of information bits representing the nth QPSK symbol, $T_s$ is the symbol period, and $\phi_n$ is the arbitrary phase offset. The digital 8-bit in-phase signal I 281 and the digital 8-bit quadrature signal Q 282 are output from the matched filter pair 240 to QPSK detector 280 of FIG. 2. The output rate of the symbol synchronizer 240 is ⅛ the rate of the incoming sampled symbols.

Signals I,Q 281 and 282 also are input to fourth power element 302. Fourth power element 302 removes the modulation in the signal whose phase constellation is spaced at $\pi/2$. Since the fourth power multiplies the exponent by four, then $4 \cdot \pi/2$ is $2\pi$, which is the modulus of the phase. Thus, the fourth power element 302 eliminates modulation in the signals 281 and 282:

$$[S_{MF}(n)]^4 = a^4 \cdot e^{j(8\pi \cdot \Delta f \cdot nT_s + 4\phi_n)} + noise4(n) \quad (5)$$

The fourth power signal is then input to the frequency discriminator 304 of the carrier tracking element 260, which computes a complex difference phasor between successive samples. Frequency discriminator 304 inputs a current sample and includes two one-period delay elements 340, which yield a previous sample. Frequency discriminator 304 performs a complex multiply operation on the current symbol and the previous symbol using four multipliers 342, the adder 344, and the subtractor 346. The output of frequency discriminator 304 can be approximately represented (approximation assumes successive samples have equal magnitude and phase offset) by:

$$X_n + j \cdot y_n = [S_{MF}(n)]^4 \cdot ([S_{MF}(n-1)]^4)^* = a_n^8 \cdot e^{j8\pi \cdot \Delta f \cdot T_s} + noise8(n) \quad (6)$$

Frequency discriminator 304 outputs X signal 350 and Y signal 352 to the frequency error estimator 306 of the carrier tracking element 260.

The frequency error estimator 306 determines an instantaneous frequency error $\theta$. The frequency error estimator 306 includes two absolute value elements 354 and 356, a subtractor 358, two adders 360 and 362, a sign determiner 364, a multiplier 366, and a normalizer 367. In other implementations of the invention, the frequency locked loop of carrier tracking loop 220 derives an error signal $\theta$ from the imaginary element (I) of the previous expression, or uses y/abs(x) to "normalize" the dynamic range of the output from carrier tracking element 260. Both of these techniques, however, limit the frequency range of the phase discriminator, since the error signal starts to diminish as the magnitude of the frequency error exceeds ¹⁄₁₆ of the symbol rate. In another implementation, the frequency range is extended (and response time improved) by computing the arctangent of (x+jy) over $2\pi$ radians. This embodiment extends the frequency range of the frequency locked loop to ±⅛ of the symbol rate. However, the $2\pi$ arctangent is computationally complex, and responds to noise when the signal fades. Thus, various ones of the described implementations are used, depending on the operating environment.

In FIG. 3, the frequency error estimator 306 receives X signal 350, Y signal 352, and a constant NORM signal 355. The frequency error estimator 306 determines an instantaneous frequency error in accordance with the following equation:

$$\theta_n = \frac{y_n + (|X_n| - X_n) \cdot sgn(y_n)}{|X_n| + |Y_n| + NORM} \quad (7)$$

In the absence of noise, an error signal $\theta_n$ 368 is a monotonically increasing function of the arctangent over $\pm\pi$ radians. In the presence of noise, the output $\theta_n$ 368 of the frequency error estimator 306 is actually represented by the same function convolved with the probability density function of the phase noise process. Furthermore, in the presence of noise, the error signal is suppressed as the magnitude of signals X and Y 350 and 352 drop below the constant NORM 355. NORM 355 is preferably 3 dB above the noise floor (i.e., the mean of (|X|+|Y|) in the absence of a signal).

Use of the NORM signal 355 allows the carrier tracking element 260 to "flywheel" through signal fades. The expression allows the input signal to operate over a very high dynamic range without changing the characteristics of the carrier tracking loop 220. The NORM signal acts to "suppress" output from the carrier tracking element 260 when signal fade occurs. This is in contrast to conventional systems, in which the loop gain increases with the signal magnitude. The value of NORM is approximately set to the magnitude of x+jy corresponding to the point where the signal approaches a fading condition and the loop response is to be suppressed.

The NORM signal 355 preferably is determined as described in the following paragraph. If the noise variance of each symbol out of the matched filter is $q^2/8$ (e.g., 8 samples per symbol and q is set to the root mean squared (rms) thermal noise into the carrier tracking loop 220), then the amplitude of the signal element (ignoring noise) of the x+jy signal is approximately:

$$a^8 = \frac{q^8}{16} \left[ \frac{E_b}{N_o} \right]^4 \quad (8)$$

The NORM signal 355 is set equal to this value at the appropriate level of $E_b/N_o$ where fading is determined to begin.

The error signal $\theta_n$ 368 is then processed by the loop filter formed of, e.g., the constant gain $\alpha$ element 308, the lossy digital integrator 310 with gain $\beta$ 372, and the perfect integrator 312. The values of $\alpha$ and $\beta$ are chosen to establish the best compromise between response time, tracking accuracy, and ensuring closed-loop stability. The output of the perfect integrator 312 controls the frequency of the NCO 314 as described below.

In one implementation, a separate frequency acquisition algorithm is used to estimate the initial carrier offset error of the perfect integrator 312 and to set the initial frequency stored in the integrator 312, which provides the frequency control for the NCO 314. Because this frequency error can change over time due to, e.g., vehicle acceleration, the frequency offset error must be tracked and compensated.

II. The Numerically Controlled Oscillator

Figure 5:
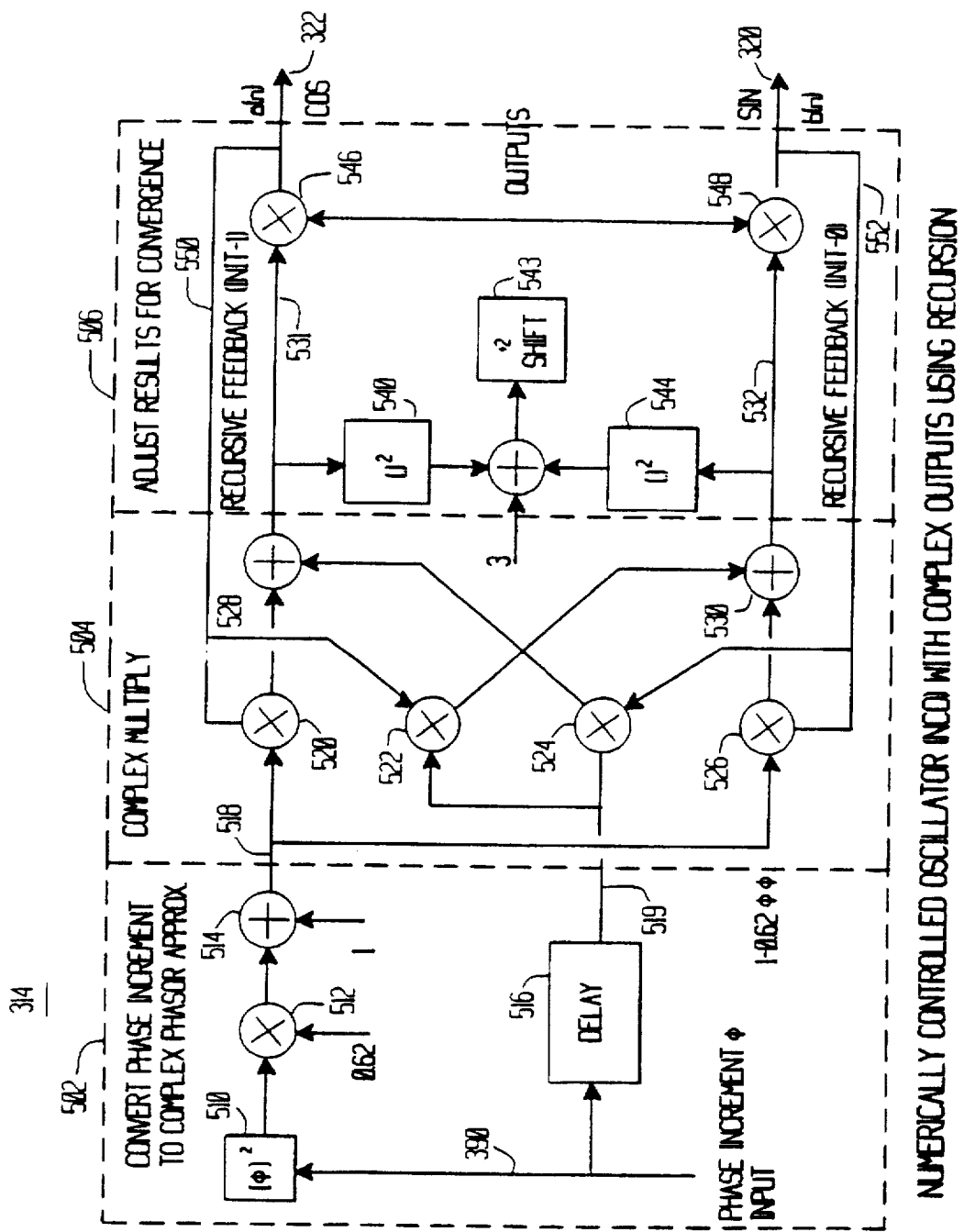
FIG. 5 is a schematic block diagram of a recursive numerically controlled oscillator of the carrier tracking loop of FIG. 3.
Figure 6:
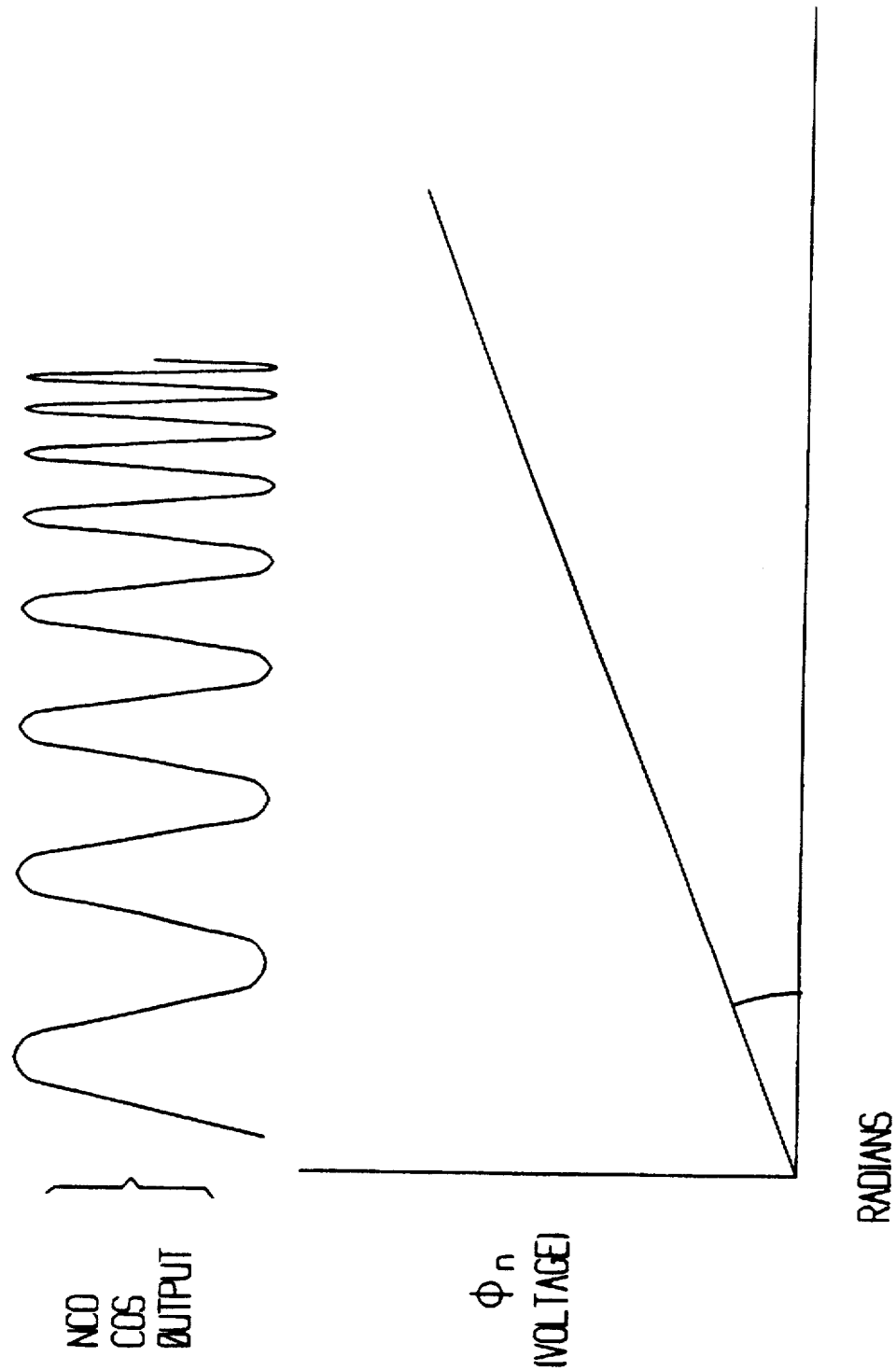
FIG. 6 is a graph showing a relationship between a value of a phase increment $\phi$ input to a numerically controlled oscillator of FIG. 3 and a cosine value output from the oscillator.

FIG. 5 is a schematic block diagram of the recursive numerically controlled oscillator (NCO) 314 of the carrier tracking loop of FIG. 3. The NCO 314 uses a recursive method to generate complex exponential (sine and cosine) outputs 320 and 322. The described embodiment is a very efficient implementation of the invention and achieves high spectral purity of the synthesized complex exponential. Specifically, the phase noise is due only to the precision of the processor 38 that implements the computer instructions. FIG. 6 shows that as $\phi$ increases, a frequency of cosine signal 322 (and of sine signal 320) also increases.

Figure 7:
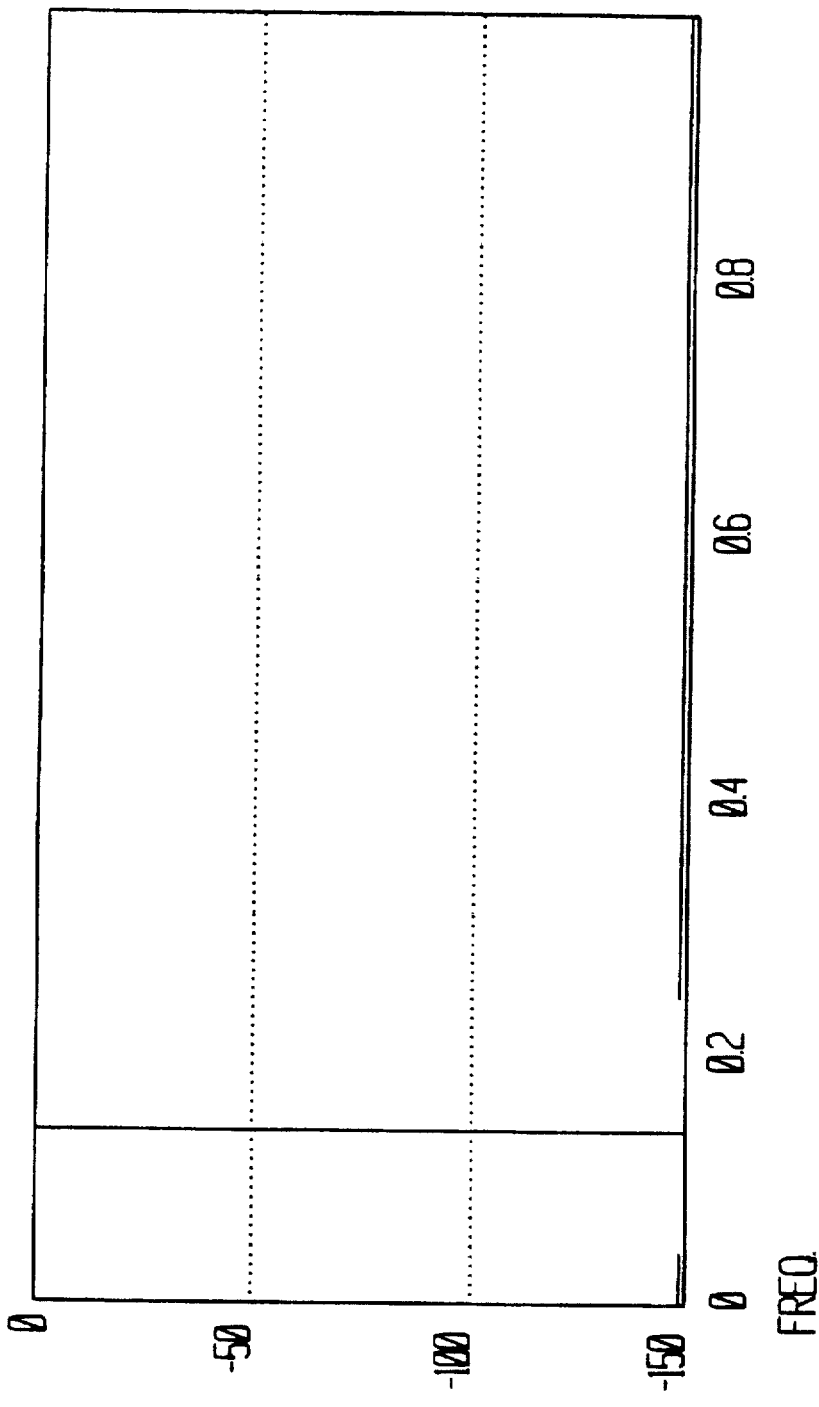
FIG. 7 is a graph showing a performance of the numerically controlled oscillator of FIG. 5.

A sample plot of the spectrum output from the NCO 314 for a given $\phi$ is shown in FIG. 7. This plot shows a 1024 point FFT of a complex exponential generated by the NCO 314 at near the predicted worst case frequency. The exact frequency was chosen so that the side lobes were eliminated by uniformly windowing a whole number of cycles contained in the 1024 points. Integrating over the 1024 frequency bins of the FFT, the total noise is about −120 dB from the signal (60 dB or better than the predicted bound).

As shown in FIG. 5, the NCO 314 includes a complex phasor approximator 502, a complex multiplier 504, and a recursive normalizer 506. The complex phasor approximator 502 inputs phase increment $\phi$ 390 from integrator 312 of FIG. 3 and outputs complex phasor increment 518 and 519. The complex phasor approximator 502 also includes a squaring element 510, a multiplier 512, a subtractor 514, and a delay element 516.

The complex phasor approximator 502 converts the scalar phase increment signal 390 to a complex phasor increment 518 and 519. The scalar phase increment 390 is limited to an alias frequency that is conservatively less than that limited to about π/4 radians per sample. During this conversion, processor 38 makes an approximation to the imaginary element (sine), then determines an appropriate real (cosine) element to optimize spectral purity. The following paragraph discusses how the imaginary signal 519 and the real signal 518 are determined.

For small values of $\phi$ (e.g., $\phi$<1), sin($\phi$)≈$\phi$. Thus, in FIG. 5, complex phase approximator 502 yields an unnormalized imaginary signal 519, the phase increment 390 is passed through the delay element 516 (to compensate for the time used by the remainder of the complex phasor approximator 502), but is not otherwise altered. A person of ordinary skill in the art will understand that other delays (not shown) may occur in the carrier tracking loop 220 and specifically in the NCO 314 as needed. A key factor in producing a "pure" sine wave is to start with an unnormalized increment phasor that is as close to unity magnitude as is practical. The real element 518 is found by approximating a "cosine-like" function. It is desirable to obtain spectral purity, but not necessarily to obtain an exact resulting frequency. The frequency can be corrected by other means as described below. Thus, the real element 518 can be found such that the magnitude of the increment phasor is near unity. Instead of computing a cosine approximation, processor 38 expands a series to approximate the unity magnitude solution, resulting in the expression for real element signal 518:

$$a^2 + \phi^2 = 1;$$

$$a = \sqrt{1-\phi^2} = 1 - \frac{\phi^2}{2} - \frac{\phi^4}{8} - \frac{\phi^6}{16} - \dots \quad (9)$$

where a is the real element 518 of the increment phasor. When this series is truncated, a positive bias exists. The error due to this bias can be reduced by adjusting the last coefficient in the truncated series. After truncation of all but two terms, a good approximation of the series for the real element 515 of the phasor increment is:

$$a=1-0.62\phi^2$$

Therefore, the phasor increment approximation 518, 519 is defined as:

$$\text{phasor\_inc} \equiv a(n)+j\cdot b(n) \equiv 1-0.62\cdot\phi_n^2+j\cdot\phi_n \quad (10)$$

where j is the square root of −1. The increment phasor of approximately unity magnitude is a function of the phase increment 390.

The complex multiplier 504 inputs the real signal 518 and the imaginary signal 519 and outputs real and imaginary signals 531 and 532. The complex multiplier 504 also inputs recursive feedback signals 550 and 552 output from the recursive normalizer 506. The complex multiplier 504 includes four multipliers 520, 522, 524, and 526, a subtractor 528, and an adder 530. The complex multiplier 504 multiplies the phase increment 518 and 519 and determines the previous complex exponential output. This is the basic recursive operation of the NCO 314.

$$c(n)+j\cdot d(n)=[a(n-1)+j\cdot b(n-1)]\cdot \text{phasor\_inc} \quad (11)$$

where c(n) and d(n) are the unnormalized output phase samples.

The recursive normalizer 506 input signals 531 and 532 and outputs sine and cosine signals 320 and 322. The recursive normalizer also outputs recursive feedback signals 550 and 552 to complex multiplier 504. The recursive normalizer 506 includes two squaring elements 540 and 544, a subtractor 542, a shifter (divide by 2) 543, two multipliers 546 and 548, and a constant signal "3" 534. The recursive normalizer 506 normalizes signals 531 and 532 to very near unity. An exact normalization would require dividing the increment phasor by its magnitude, which would require a division operation, square root, two multiplies, and an add. This computation can be replaced by an approximation, which is very accurate since the magnitude is already very near unity by design. The normalization is defined as the first two terms of a series expansion of the normalization factor about one:

$$\frac{1}{\sqrt{I^2+Q^2}} \approx 1-\frac{1}{2}\cdot(I^2+Q^2-1)+\dots \approx \frac{3-I^2-Q^2}{2} \quad (12)$$

The division by 2 preferably is implemented by shifter 543

Thus, in summary, the output of NCO 314 can be expressed as: (13)

$$a(n)+j\cdot b(n) = [c(n)+j\cdot d(n)]\cdot \frac{[3-c(n)^2-d(n)^2]}{2};$$

where $$c(n)+j\cdot d(n) = [a(n-1)+j\cdot b(n-1)]\cdot[1-0.62\cdot\phi^2+j\cdot\phi].$$

It is important to note that the normalization is done within the recursive loop in oscillator 314, and that the previous exponential output sample is a factor in the next output, which is also normalized. The closed loop in oscillator 314 ensures that the magnitude converges to unity.

The following is an analysis of the operation of the NCO 314. A bound on the worst case amplitude errors can be analyzed by first observing a worst-case increment phasor deviation from unity. Setting the derivative of the increment phasor magnitude as a function of φ 390 equal to zero, and then solving for φ, will yield the maximum increment phasor magnitude error.

$$\frac{\partial |a(n) + j \cdot b(n)|}{\partial \phi} \equiv 0; \quad (14)$$

$$\text{then } \phi \approx 0.812$$

When φ is the worst case value, this corresponds to a magnitude of 0.951833 (it should be nearly 1). When the normalization is applied, the magnitude becomes 0.9965575. If this peak error is uniformly distributed about nominal unity, then the total mean square error (MSE) is at least −60 dB from the signal power. As shown in FIG. 7, the actual performance, however, is much better than this bound. Additionally, it is likely that a portion of this MSE power is contained at the desired frequency lowering the effective MSE.

As discussed above, setting the increment phasor to unity is more important than the resulting frequency error when setting the real and imaginary elements 518 and 519. Therefore, a deterministic frequency error exists. Although not all NCO applications require absolute frequency accuracy, another implementation of the invention includes an optional portion that corrects the frequency. If the desired phase increment is Θ radians per sample, then use the following approximation:

$$\tan(\theta) = \frac{\theta}{1 - 0.62 \cdot \Phi^2}; \quad (15)$$

$$\text{then } \Phi = \frac{-1 + \sqrt{1 + 4 \cdot 0.62 \cdot \tan^2(\theta)}}{2 \cdot (0.62 \cdot \tan(\theta))}$$

In another implementation, the value of φ does not change nearly as often as the sample rate, so it is practical to compensate φ only when needed. An efficient approximation for determining a frequency correction (called "prewarping") is:

$$\phi_n = \Theta_n \cdot [1 - 0.286 \cdot \Theta_n^2 \cdot [1 - 0.9 \cdot \Theta_n^2 \cdot [1 - 0.579 \cdot \Theta_n^2]]] \quad (16)$$

In an alternate implementation, if needed, arbitrarily higher accuracy and/or lower amplitude noise can be obtained in NCO 314 by expanding the two series approximations to more than the present two terms each. One additional imaginary element substantially improves the accuracy, if the time for additional processing exists.

This technique can directly accommodate a phase increment range of at least +−45 degrees (+−0.125 normalized frequency). In another embodiment, an entire frequency range up to the alias can be easily synthesized by using phase rotation in quadrants +−(1+−j).

III. Matched Filter Pair and Symbol Synchronizer

Figure 8:
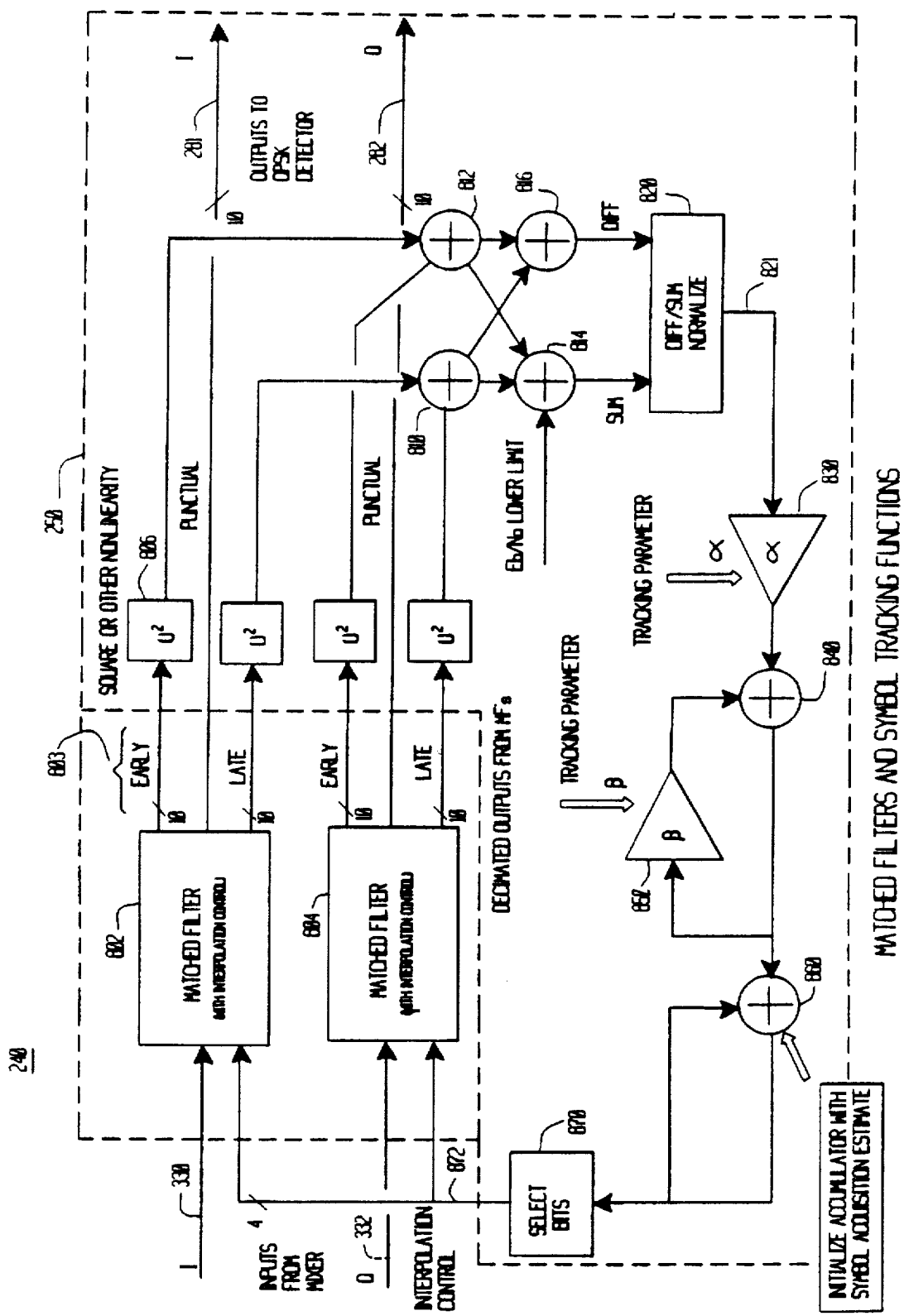
FIG. 8 is a schematic block diagram of a matched filter pair and a symbol synchronizer of FIG. 3.

FIG. 8 is a schematic block diagram of the matched filter pair and symbol synchronizer 240 and symbol synchronizer estimator 250 of FIG. 3, which converts a digitally modulated analog waveform into a digital data sequence. The waveform usually consists of filtered pulses (e.g., Nyquist filtered for optimal performance in noise) whose polarity represents the data stream. The elements 240, 250 find an optimal symbol timing for sampling an incoming data sequence. The input signals 330 and 332 are expressed as:

$$r(k/f_s) \equiv \sum_{n=0}^{\infty} e^{j d_n \pi/2} \cdot p(k/f_s - nT) \cdot e^{j \phi(k/f_s)} + n(k/f_s) \quad (17)$$

where d=0, 1, 2, or 3, dependent upon the data pair modulating the nth symbol, time t is replaced with sample times k/fs, p(t) is the matched filter impulse response (discussed in more detail below), φ(t) is a random phase process (e.g., Rician fading) with an arbitrary mean, fs is a sample rate, and n(t) is a complex AWGN process with single sided power spectral density No/2.

Figure 17:
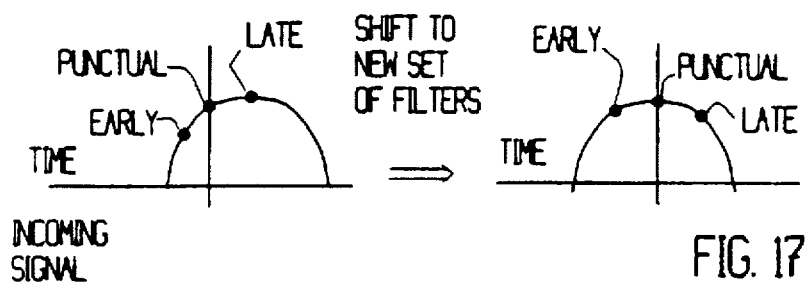
FIG. 17 shows an example of the timing of the matched filter leading the timing of the incoming signal.
Figure 18:
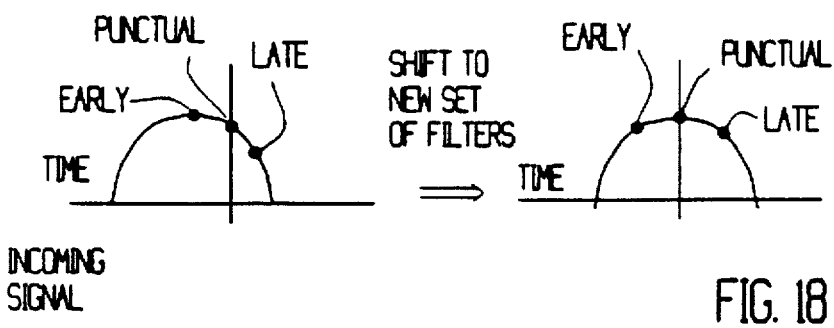
FIG. 18 shows an example of the timing of the matched filter lagging the timing of the incoming symbol.

The symbol synchronizer 240 includes a pair of matched filters 802 and 804. Matched filters 802 and 804 receive a 3-bit interpolation control signal 872, which determines an effective advance or delay of the impulse response timing of the matched filters 802 and 804 relative to the input signal 330 and 332. FIGS. 17 and 18 show an input to matched filters 802 and 804. Each incoming symbol is represented by, e.g., 8 sequential samples. Filters 802 and 804 each contain 8 sets of interpolation coefficients for each sample. Thus, the range of the interpolation control signal is 0 to 7 values where this range is modulo one sample period. In the described embodiment, a select bits element 870 selects, e.g., the 14th through 12th bits of a signal output from integrator 860 to be the 3-bit interpolation signal input to the matched filters 802 and 804. Symbol synchronization is established when the interpolation control sets the matched filter timing coincident with the incoming symbol timing. The matched filter timing is adjusted by using one of e.g., eight sets of filter coefficients in each filter, as described below. The derivation of the weighting of the filters 802 and 804 also is discussed below.

Figure 9:
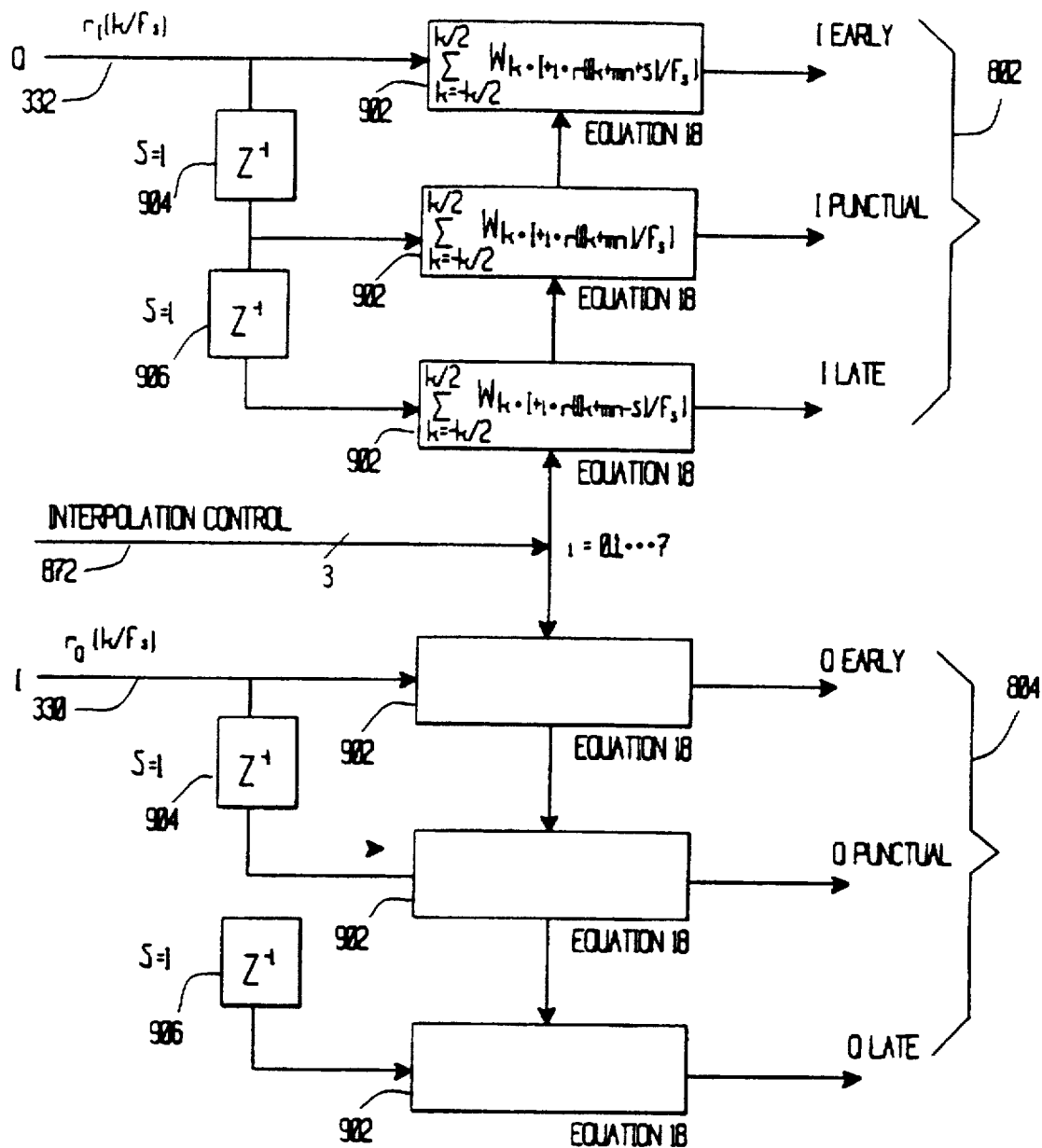
FIG. 9 is a schematic block diagram showing more detail of the matched filters of FIG. 8.

FIG. 9 shows more detail of the matched filters 802 and 804. The matched filter output signals 803 of matched filters 802 and 804 are:

$$f_{early}(n) \equiv \sum_{k=-K/2}^{K/2} W_{kJ+i} \cdot r((k + mn + \delta)/f_s) \quad (18)$$

$$f_{punct}(n) \equiv \sum_{k=-K/2}^{K/2} W_{kJ+i} \cdot r((k + mn)/f_s)$$

$$f_{late}(n) \equiv \sum_{k=-K/2}^{K/2} W_{kJ+i} \cdot r((k + mn - \delta)/f_s)$$

where m is the number of complex samples per symbol period (e.g., 8), $W_{kJ+i}$ are the filter weights (I is the number of interpolated filter coefficients between input samples, i is the particular interpolated set as indicated by the interpolation control signal 872), fs is the sample rate, and δ is the early or late time difference (set to one input sample time in the described embodiment). The matched filters 802, 804 generally span several or more symbol periods to minimize ISI (intersymbol interference) while approximating root-Nyquist characteristics.

The effective sample rate of the matched filter relative to the symbol rate determines the resolution of timing control over the symbol period (i.e., sample points per symbol). The more sample points per symbol, the more the timing resolution is improved. A key feature of this matched filter is its ability to provide very fine resolution through interpolation without increasing the sample rate. This interpolation places virtual sample points between the actual sample points. For the filter defined by equation (18), the index n sets the input sample index, while the index i sets the interpolation index. For example, if there are 8 samples per symbol (T=8), a resolution of 64 virtual samples per symbol can be achieved by using 8 sets of matched filter coefficients (i=8), each set skewed by (1/64) of a symbol period. The punctual signal is an information bearing signal and is passed out of the synchronizer. The early and late signals are used to adjust the timing of the filters as described below. The early and late matched filter outputs are rectified through appropriate non-linearity elements such as squaring elements 806 in symbol synch estimator 250.

There are three outputs (i.e., early, punctual, and late) for each I and Q signal path. Hence, as shown in FIG. 9, there are actually six matched filters. FIG. 17 shows an example of the timing of the matched filters leading timing of the incoming symbol, and the effect of changing to a different set of the eight sets of filter coefficients in each of the filters 902 in accordance with interpolation control signal 872. FIG. 18 shows an example of a sample of the timing of the matched filters lagging the timing of the incoming symbol, and the effect of changing to a different set of the eight sets of filter coefficients in each filter 902 in accordance with interpolation control signal 872.

As shown in FIG. 8, processor 38 sums the early outputs in adder 810 and sums the late outputs in adder 812. Next processor 38 adds the sums in adder 814 and finds the differences between the sums in difference element 816. Element 820 performs a normalization by dividing the difference by the sum. The output of element 820 is an error signal 821 indicating whether the matched filter symbol timing is ahead or behind the incoming symbol timing.

Figure 19:
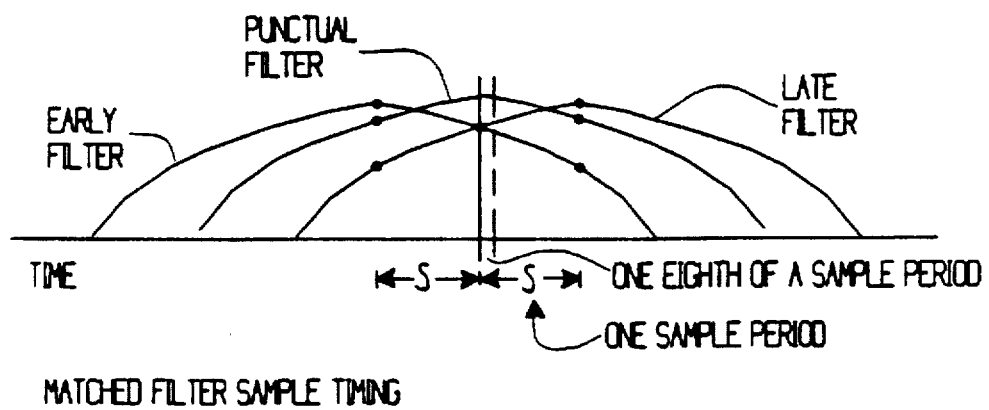
FIG. 19 shows examples of the timing of filter coefficients in the early, punctual, and late filters.

As shown in FIG. 9, filters 802 provide early, punctual, and late outputs for input I. Filters 804 provide early, punctual, and late outputs for input Q. The three-bit interpolation control signal 872 (also called "1" in FIG. 9) selects one of eight sets of filters coefficients in each filter 902. The derivation of the filter coefficients are discussed below. Delay elements 904, 906, 904', and 906' each delay the incoming signal 330, 332 by one sample period. FIG. 19 shows the matched filter timing. Each of the early, punctual, and late filters 902 uses 40 filter coefficients (one of eight possible sets of filter coefficients for that filter). If the punctual filter is centered on a symbol (solid vertical line), the outputs of the early and late filter outputs are equal. If the punctual filter is not centered on a symbol (dotted vertical line), the early and late outputs are unequal.

Because error signal 821 is a function of the square of the input signal level, the loop gain is very sensitive to the input level. The first-order gain parameter α and the second-order integration parameter β set the acquisition time and the tracking bandwidth of the closed loop. Additionally, another integrator 860 has proved to be beneficial in decreasing acquisition time while minimizing tracking (noise) bandwidth.

The parameters α and β establish an acquisition time and loop bandwidth which are valid for only one fixed input signal level. The effects of these parameters change dramatically with varying input levels. The dynamic range of the input signal can be extended arbitrarily by the normalization described next. Normalization is achieved by dividing the difference by the sum of the pairs from elements 816 and 814. This normalization extends the dynamic range indefinitely while maintaining the same acquisition time and tracking bandwidth. This assumes the SNR (Signal to Noise Ratio) is sufficiently high and that finite precision arithmetic has no effect.

In a preferred embodiment where the signal temporarily dips below an unacceptable SNR (e.g., due to Rician fading or Rayleigh fading), it is desirable to suppress the loop feedback to allow the symbol timing to "flywheel" through the fades. This fading mitigation technique is easily implemented by adding a constant term $Eb/N_o$ to the normalization denominator. The constant term is added at sum element 814. The value of this constant term is equal to the sum of the sum pair values when the signal level is at the desired break point. The output of the normalization in element 820 yields:

$$x(n) \equiv \frac{|y_{early}(n)|^2 - |y_{late}(n)|^2}{|y_{early}(n)|^2 + |y_{late}(n)|^2 + f(E_b/N_0 \text{ limit})} \quad (19)$$

where Eb/No is approximately 3 dB over a predetermined noise floor.

The output of integrator 860 is:

$$y(n) \equiv \alpha \cdot \sum_{k=0}^{n} \sum_{i=0}^{k} \beta^k \cdot x(i) \quad (20)$$

where gain constant is α and one of the integration constants is β. In some implementations, α and β are system parameters that can be set by the user. The second integrator constant for integrator 860 is assumed to be unity. Since the typical useful dynamic range of the incoming signal can be high, and since the interpolation range is the number of virtual interpolation samples over one symbol period, e.g., 64, is typically much smaller than the dynamic range, then it proves beneficial to use a larger number of bits to handle the dynamic range of the incoming signal, and use some smaller number of bits for interpolation control. The discrete time transfer function of the entire tracking closed loop under high signal conditions can be expressed as:

$$H(z) \equiv \frac{c \cdot \alpha \cdot z^2}{(z-1) \cdot (z-\beta) + c \cdot \alpha \cdot z^2} \quad (21)$$

where c is a constant derived from the timing error signal after normalization over the piecewise linear region near the optimum symbol timing.

Figure 10:
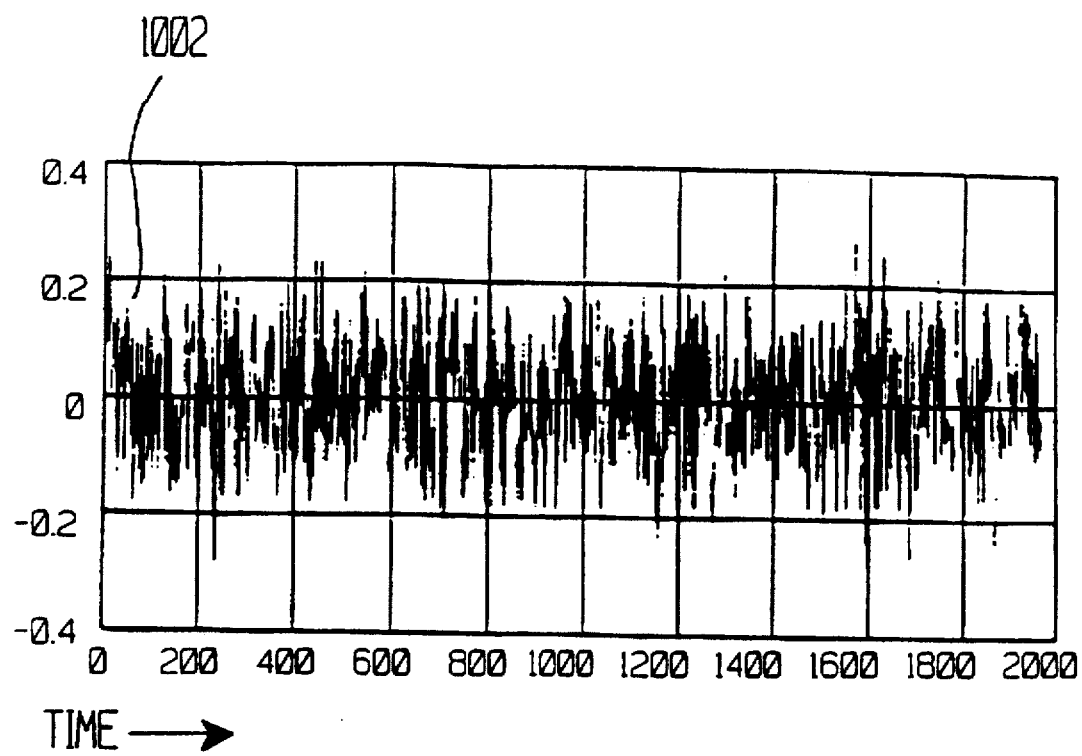
FIG. 10 is a graph of the output of a normalizer of FIG. 8.
Figure 11:
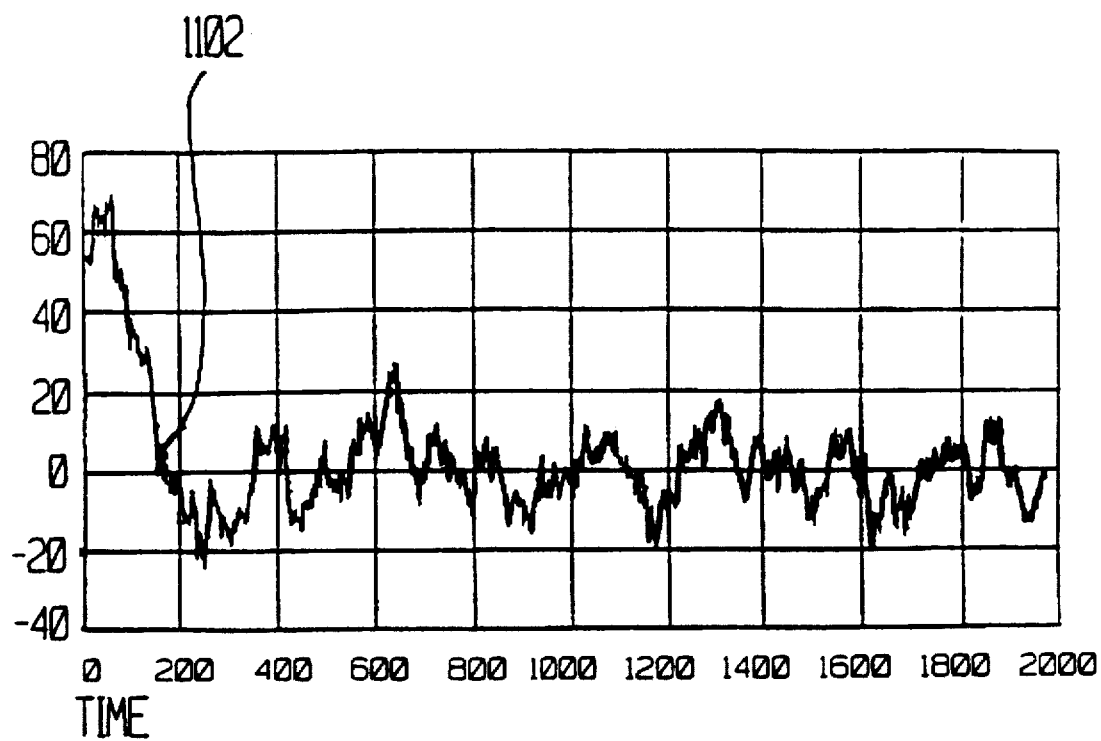
FIG. 11 is a graph of output of a first integrator of FIG. 8.
Figure 12:
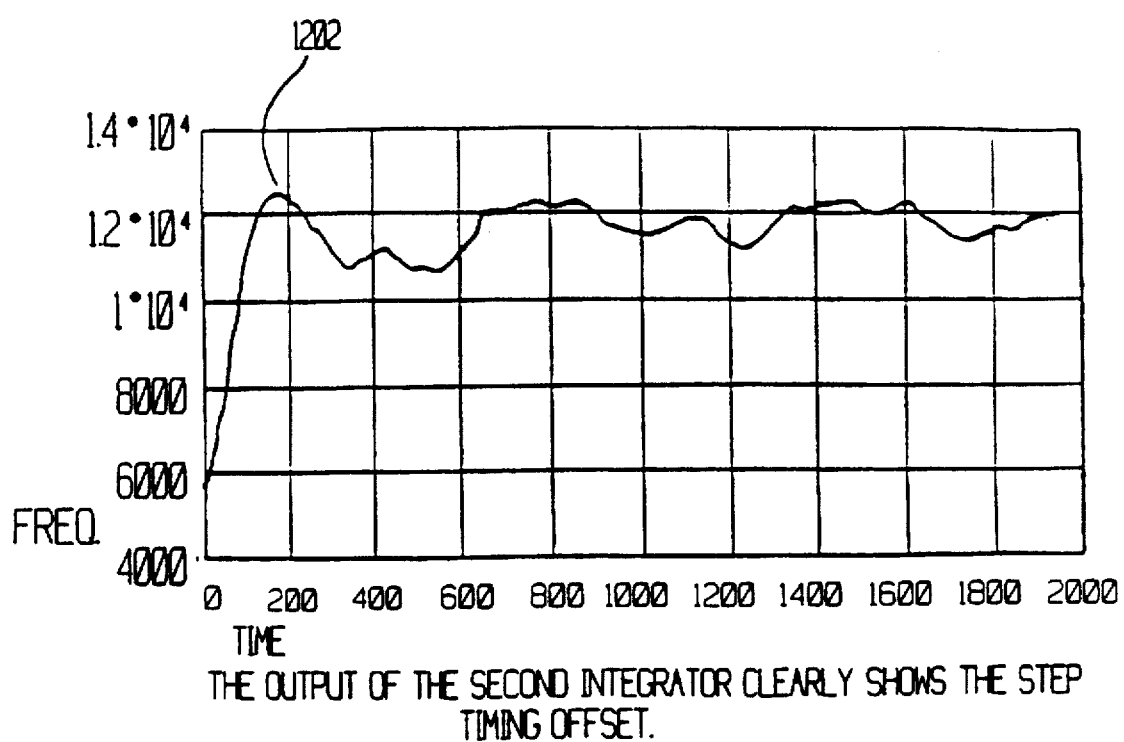
FIG. 12 is a graph of output of a second integrator of FIG. 8.
Figure 13:
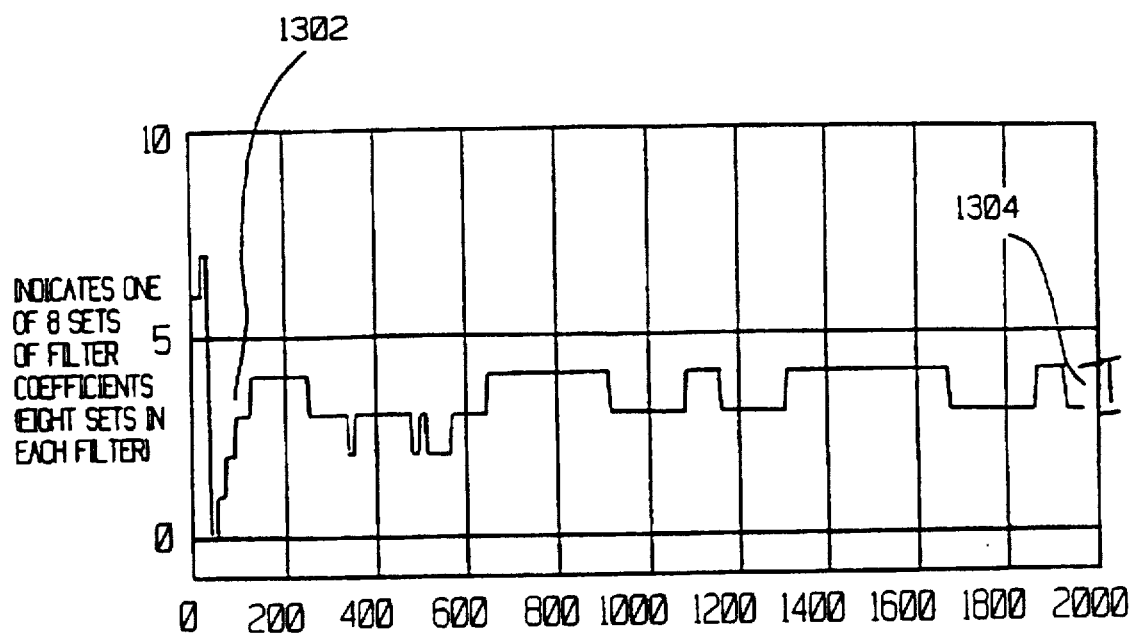
FIG. 13 is a graph of an interpolation control signal of FIG. 8.

Some plots representative of performance of the symbol synchronizer 240 of FIG. 3 are shown in FIGS. 10–13. FIG. 10 is a graph of the output of normalizer 820. In FIG. 10, an initial small bias occurs prior to point 1002 because the filters are not completely centered on the symbol yet. FIG. 11 is a graph of the output of integrator 830. In FIG. 11, symbol synchronization is achieved at approximately point 1102. FIG. 12 is a graph of the output of integrator 840. FIG. 13 is a graph of an interpolation control signal 872. In FIG. 13, interpolation control signal 872 dithers over range 1304 between two output values in an effort to keep the filters synchronized with the input signal. FIGS. 10–13 relate to a near worst case example, where the nominal SNR is 6 dB (Eb/No), and includes Rician fading (K=10 dB, 200 Hz BW) and other channel impairments. The plots show that even under these severe conditions, the symbol tracking resulted in a symbol tracking error of less than 1% rms.

Although the previous description focuses on symbol tracking, a symbol synchronized in accordance with the invention can also be used for symbol timing acquisition. It can be shown that the tracking loop will acquire the correct timing from any initial symbol timing offset. The tracking constants α and β can be adjusted to yield the best compromise between tracking noise and acquisition time. Another implementation of the invention dynamically changes these parameters, depending on whether the symbol synchronizer is in an acquisition or tracking mode. In some packet data communications systems, it is customary to provide a preamble clock sequence at the beginning of a packet. A typical clock sequence has ones and zeros to aid in symbol acquisition. This particular sequence has a spectrum of mainly line elements on either side of the actual carrier frequency spaced at half the symbol rate (=−½T). Therefore, the signal during this clock sequence can be represented by:

$$s(n) \equiv A \cdot [e^{j(2\pi(f_c+f_1/2)nT+\phi)} + e^{j(2\pi(f_c-f_1/2)nT+\phi)}] \quad (22)$$

The symbol clock can be produced by forming the product of each symbol with its own complex conjugate. A phasor containing the phase of this clock can be extracted by producing a correlation sample (for a single point in time) through the following:

$$e^{j\phi} = \sum_{k=1}^{K} e^{-j2\pi f_s kT} [s(n-k) \cdot s^*(n+k)] \quad (23)$$

$$s(n) \cdot s^*(n) = A^2 \cdot [2 + e^{j2\pi f_s nT+\phi} + e^{j2\pi f_s nT-\phi}]$$

$$= 2A^2 \cdot [1 + \cos(2\pi f_s nT + \phi)]$$

The phase of this result can be determined by computing:

$$\phi \equiv \text{ARCTAN}\left[\frac{\Im(e^{j\phi})}{\Re(e^{j\phi})}\right] \quad (24)$$

This phase (2π radians=1 symbol) is added to the symbol time modulo one symbol relative to the timing of the input sample set. This value sets the initial interpolation timing control for the matched filter 240 by initializing the accumulator of the second integrator with the symbol acquisition estimate, effectively receiving instant symbol synchronization.

IV. Derivation of a Matched Filter

The following paragraphs discuss derivation of a matched filter with a root cosine Nyquist characterization with rolloff parameter (b=0% to 100%).

The channel consisting of the cascade of both the transmitter and receiver matched filters, and ignoring other impairments is to have a raised cosine spectrum with a roll-off factor of b=60%. The matched filters have a spectrum that is the square root of the channel characteristics. This 60% root-cosine filter is most easily represented as follows:

$$T = 8b = 0.6j = \sqrt{-1} \quad (25)$$

$$H(f) = \cos\left[\left(\frac{2 \cdot \pi \cdot T}{4 \cdot b}\right) \cdot \left(f + \frac{1-b}{2 \cdot T}\right)\right] \quad -\frac{1+b}{2 \cdot T} < f < -\frac{1-b}{2 \cdot T}$$

$$H(f) = 1 \quad -\frac{1-b}{2 \cdot T} < f < \frac{1-b}{2 \cdot T}$$

$$H(f) = \cos\left[\left(\frac{2 \cdot \pi \cdot T}{4 \cdot b}\right) \cdot \left(f - \frac{1-b}{2 \cdot T}\right)\right] \quad \frac{1-b}{2 \cdot T} < f < \frac{1+b}{2 \cdot T}$$

The impulse response as a continuous function of t can be found by computing the inverse Fourier transform of the matched filter's transfer function. The impulse response is:

$$h(t) = \frac{16 \cdot b^2 \cdot t \cdot \sin\left[\pi \cdot (1-b) \cdot \frac{t}{T}\right]}{\pi \cdot (T^2 - 16 \cdot b^2 \cdot t^2)} + \quad (26)$$

-continued $$\frac{4 \cdot b \cdot T \cdot \cos\left[\pi \cdot (1+b) \cdot \frac{t}{T}\right]}{\pi \cdot (T^2 - 16 \cdot b^2 \cdot t^2)} + \frac{\sin\left[\pi \cdot (1-b) \cdot \frac{t}{T}\right]}{\pi \cdot t}$$

where, e.g., t (in units of sample periods) has the following values:
t=−19½ . . . +19½ for the punctual signal
t=−18½ . . . +20½ for the late signal
t=−20½ . . . +18½ for the early signal Thus, as shown in FIG. 19, the early and late signal lead and lag the punctual signal, respectively, by one sample.

Other embodiments will be apparent to those skilled in the art from consideration of the specification and practice of the invention disclosed herein. It is intended that the specification and examples be considered as exemplary only, with a true scope of the invention being indicated by the following claims.

What is claimed is:

1. A symbol synchronizer in a telecommunications device, comprising:

a plurality of filters, receiving a sequence of incoming pairs of inphase and quadrature signals in accordance with a symbol timing, each of the pair of matched filters outputting an early signal, a punctual signal, and a late signal, the early signal and the late signal indicating an error in synchronization between the symbol timing of the received signals and the timing of the matched filter, and the punctual signal being an information bearing signal indicating the contents of the received inphase and quadrature signals;

a symbol synchronizing estimator, connected to the plurality of matched filters, receiving from each of the pair of matched filters the early signal and the late signal and outputting an interpolation signal to the pair of matched filters;

means for adjusting the relative delay of the matched filters with regard to the symbol timing of the received signal in accordance with the interpolation signal;

wherein the symbol synchronizing estimator includes rectifying means for rectifying the early signal and the late signal and for outputting a plurality of rectified signals; and means, connected to the rectifying means, for determining a sum signal of the rectified signals and a difference signal of the rectified signals; and further including a normalizer for normalizing the sum and difference signal by the sum signal.

2. A symbol synchronizer in a telecommunications device, comprising:

a plurality of filters, receiving a sequence of incoming pairs of in-phase and quadrature signals in accordance with a symbol timing, each of the pair of matched filters outputting an early signal, a punctual signal, and a late signal, the early signal and the late signal indicating an error in synchronization between the symbol timing of the received signals and the timing of the matched filter, and the punctual signal being an information bearing signal indicating the contents of the received in-phase and quadrature signals;

a symbol synchronizing estimator, connected to the plurality of matched filters, receiving from each of the pair of matched filters the early signal and the late signal and outputting an interpolation signal to the pair of matched filters; and means for adjusting the relative delay of the matched filters with regard to the symbol timing of the received signal in accordance with the interpolation signal;

wherein the symbol synchronizing estimator includes suppression means for suppressing the interpolation signal when the received signals fall below a predetermined signal to noise ratio, thereby enabling the symbol synchronizer to "flywheel" through signal fades;

wherein the suppression means is a constant value in a normalizer for normalizing a sum and a difference signal based on the received in-phase and quadrature signals.

3. A symbol synchronizer in a telecommunications device, comprising:

a plurality of filters, receiving a sequence of incoming pairs of in-phase and quadrature signals in accordance with a symbol timing, each of the pair of matched filters outputting an early signal, a punctual signal, and a late signal, the early signal and the late signal indicating an error in synchronization between the symbol timing of the received signals and the timing of the matched filter, and the punctual signal being an information bearing signal indicating the contents of the received in-phase and quadrature signals;

a symbol synchronizing estimator, connected to the plurality of matched filters, receiving from each of the pair of matched filters the early signal and the late signal and outputting an interpolation signal to the pair of matched filters; and means for adjusting the relative delay of the matched filters with regard to the symbol timing of the received signal in accordance with the interpolation signal wherein the adjusting means includes means for switching between a plurality of sets of filter coefficients in the matched filters;

wherein each matched filter has eight sets of coefficients, the timing of each set differing by one eighth of a sample.

* * * * *